United States Patent [19]

Malhi

[11] Patent Number: 4,914,739

[45] Date of Patent: Apr. 3, 1990

[54] STRUCTURE FOR CONTACTING DEVICES IN THREE DIMENSIONAL CIRCUITRY

[75] Inventor: Satwinder S. Malhi, Garland, Tex.

[73] Assignee: Texas Instruments, Incorporated, Dallas, Tex.

[21] Appl. No.: 357,658

[22] Filed: May 25, 1989

Related U.S. Application Data

[63] Continuation of Ser. No. 801,039, Nov. 22, 1985, abandoned, which is a continuation-in-part of Ser. No. 666,715, Oct. 31, 1984, abandoned.

[51] Int. Cl.$^4$ .............................................. H01L 29/78
[52] U.S. Cl. ..................................... 357/23.6; 357/41; 357/51
[58] Field of Search ..................... 357/23.1, 23.4, 23.6, 357/41, 51, 55

[56] References Cited

U.S. PATENT DOCUMENTS

| | | | |
|---|---|---|---|
| 4,199,772 | 4/1980 | Natori et al. | 357/23.6 |
| 4,630,088 | 12/1986 | Ogura et al. | 357/55 X |
| 4,630,237 | 12/1986 | Miura et al. | 357/55 X |
| 9,649,625 | 3/1987 | Lu | 357/23.6 |

FOREIGN PATENT DOCUMENTS

| | | | |
|---|---|---|---|
| 54-108586 | 8/1979 | Japan | 357/23.6 |
| 8103241 | 11/1981 | PCT Int'l Appl. | 357/23.6 |

OTHER PUBLICATIONS

Sodini et al., "Enhanced Capacitor for One-Transistor Memory Cell", IEEE Trans. on Elec. Dev., Oct. 1976, pp. 1187-1189.

Primary Examiner—Andrew J. James
Assistant Examiner—Sara W. Crane
Attorney, Agent, or Firm—Stanton C. Braden; Rodney M. Anderson; Melvin Sharp

[57] ABSTRACT

The present invention is described in conjunction with the fabrication of a dRAM cell which an important application of the present invention. The described cell provides a one-transistor/one-capacitor dRAM cell structure and array in which the cell transistor is formed on the sidewalls of a substrate trench containing the cell capacitor; the word and bit lines cross over this trench. This stacking of the transistor on top of the capacitor yields a cell with minimal area on the substrate and solves a problem of dense packing of cells. One capacitor plate and the transistor channel and source region are formed in the bulk sidewall of the trench and the transistor gate and the other plate of the capacitor are both formed in polysilicon in the trench but separated from each other by an oxide layer inside the trench. The signal charge is stored on the polysilicon capacitor plate by an electrical connection of the source region with the polysilicon capacitor plate. The described embodiment provides an electrical connection which facilitates the electrical characterization of the transistor and the capacitor by allowing separate connection to the transistor or the capacitor.

5 Claims, 7 Drawing Sheets

STRUCTURE FOR CONTACTING DEVICES IN THREE DIMENSIONAL CIRCUITRY

RELATED APPLICATIONS

This application is a continuation of Ser. No. 801,039, filed 11/22/85 now abandoned, which is a continuation-in-part of Ser. No. 666,715 filed Oct. 31, 1984, now abandoned.

FIELD OF THE INVENTION

The present invention relates to the field of integrated circuit fabrication methods. More specifically, the present invention relates to methods for forming connetions to circuit components formed in deeply etched trenches in integrated circuitry.

BACKGROUND OF THE INVENTION

It is widely known in the art that metal-oxide semiconductor (MOS) capacitors provide superior performance over other capacitor structures in integrated circuitry. One area where MOS capacitors are superior is in charge integrity when the capacitor is struck by an alpha particle. This is particularly important in dynamic random access memories (dRAMs). Alteration of the charge on the storage capacitor in a dRAM cell causes an error in the data stored. This is one form of soft error and is a widely recognized problem. MOS capacitors are less susceptible to soft errors because the alpha particle must impart enough energy to an electron to bring the electron up to conduction band of the oxide, which is very high.

One recently developed embodiment of an MOS capacitor is the trench capacitor. This capacitor is formed by etching a cavity (the trench) in the surface of a substrate, forming an insulator on the sides of the trench and filling the trench with a conductive material. One plate of the capacitor is formed by the conductive material in the trench, and the other by the substrate. In order to provide the above mentioned soft error characteristic, the charge must be stored on the inner conductive layer which is electrically isolated from the substrate by the insulator. Electrical contact to the conductive layer can be made at the top of the the trench by the usual integrated circuit interconnect techniques. However, a better method for contacting the conductive layer allows the use of the upper portion of the trench for other purposes. One such purpose is the incorporation of a pass transistor formed in the upper portion of the cavity which is connected to the capacitor, thus forming a dRAM cell in a trench. A type of trench dRAM cell is the subject of the parent application of this case.

A problem with the trench cell arrangement is that the capacitor and the transistor cannot be accessed separately. The capability for accessing the separate components is important in characterization of the components during development and manufacture of an integrated circuit using the trench cell and is useful in circuit design.

SUMMARY OF THE INVENTION

The present invention is described in conjunction with the fabrication of a dRAM cell which is an important application of the present invention. The described cell provides a one-transistor/one-capacitor dRAM cell structure and array in which the cell pass transistor is formed on the sidewalls of a substrate trench containing the cell capacitor; the word and bit lines cross over this trench. This stacking of the transistor on top of the capacitor yields a cell with minimal area on the substrate and solves a problem of dense packing of cells.

One capacitor plate and the transistor channel and source region are formed in the bulk sidewall of the trench, and the transistor gate and the other plate of the capacitor are both formed in polysilicon in the trench but separated from each other by an oxide layer inside the trench. The signal charge is transferred to the polysilicon capacitor plate by an electrical connection of the source region of the vertical pass transistor with the polysilicon capacitor plate. The described embodiment provides an electrical connection which facilitates the electrical characterization of the transistor and the capacitor by allowing separate connection to the transistor or the capacitor.

DESCRIPTION OF THE PREFERRED EMBODIMENTS

Figure 1A:
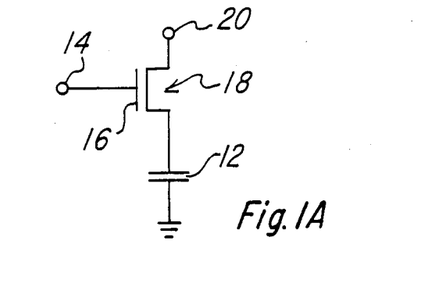
FIGS. 1A and 1B are the schematic equivalent circuit and local memory array geometry for preferred embodiment dRAM cells.

The dRAM cells are one transistor/one capacitor cells connected to bit and work lines as shown in schematic FIG. 1A and operate as follows. Capacitor 12 stores charge to represent a bit of information (for example, no stored charge could represent a logic O and the stored charge corresponding to a potential of 5 volts across the capacitor plates could represent a logic 1). The bit of information is accessed (to read or to write a new bit) by applying a voltage on word line 14 connected to gate 16 to turn ON transistor 18; a turned ON transistor 18 connects capacitor 12 to bit line 20 for the read or write operation. Leakage currents and other sources of decay of the charge on capacitor 12 necessitate periodic refreshing of the charge, and thus the name dynamic RAM (dRAM).

Figure 1B:
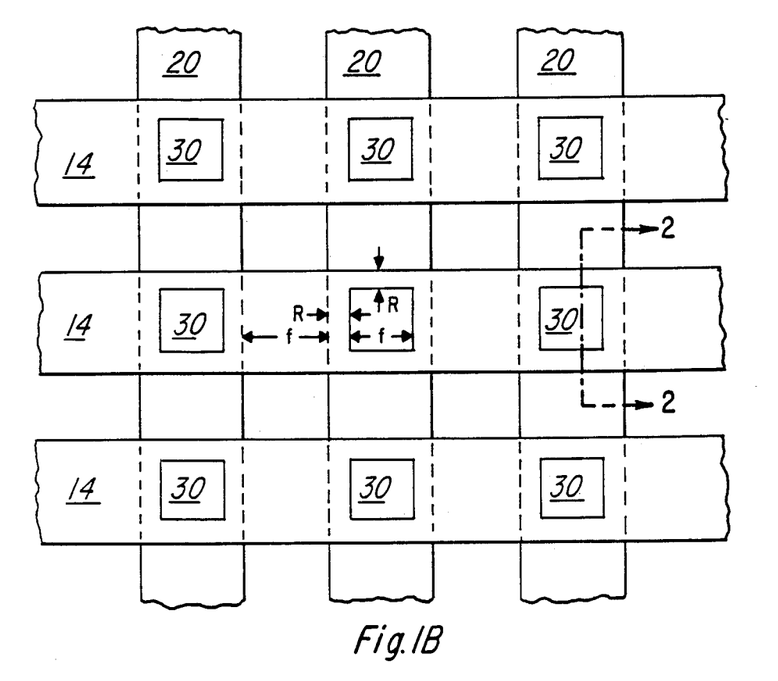

FIGS. 1B is a plan view showing a portion of a dRAM array of bit lines 20 and word lines 14 with preferred embodiment cells 30 at the intersections of the lines; note that bit lines 20 pass under word lines 14. The cells extend down into the substrate below thelines and provide a maximal density memory. If the minimum feature size is denoted by f and the minimum registration is denoted by R, then the cell area is $[2(f+R)]2$. For example, with a minimum feature size of 1.0 micron and a minimum registration tolerance of 0.25 micron, the cell area is about 6.25 square microns.

Figure 2:
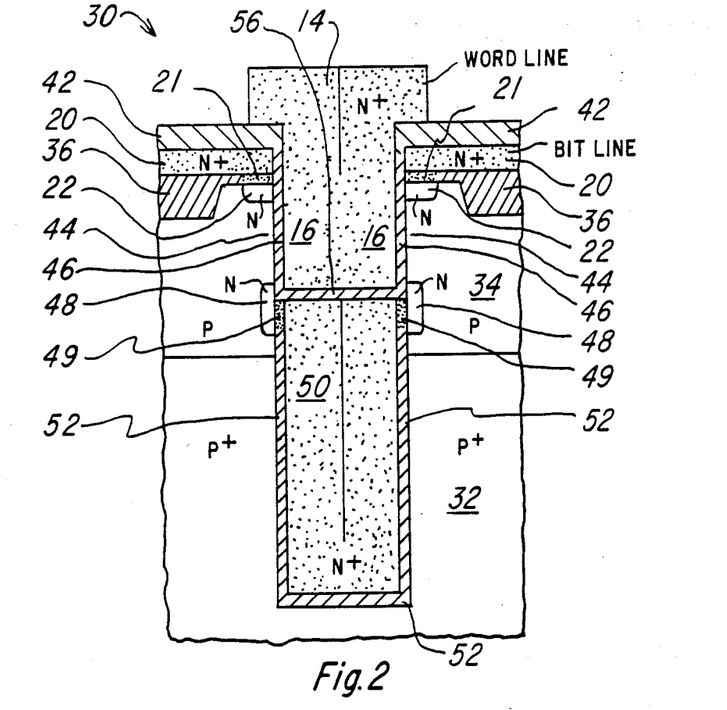
FIG. 2 is a schematic cross sectional elevation of a first preferred embodiment dRAM cell taken along line 2—2 of FIG. 1B.

FIG. 2 is a cross-sectional view of the first preferred embodiment dRAM cell, generally denoted 30. Cell 30 is formed in p+ silicon substrate 32 with p epilayer 34 and includes n+polysilicon bit line 20, bit line insulating nitride 42, field oxide 36, n+polysilicon word line 14, transistor 18 channel 44, transistor 18 gate oxide 46, n diffused region 48 which forms the source for transistor 18, n+ polysilicon region 50 which forms one of the plates of capacitor 12 with p+substrate 32 forming the other and ground plate, oxide 52 which forms the insulator between the plates of capacitor 12, insulating oxide 56 which separates word line 14 from capacitor plate 50, n diffused region 22 which forms the drain of transistor 18, n polysilicon region 21 which connects bit line 20 with drain region 22, and n polysilicon region 49 which connects source 48 with n+capacitor plate 50. Gate 16 of transistor 18 is simply that portion of word line 14 that is across gate oxide 46 from channel region 44. The view of cell 30 in FIG. 2 corresponds to a section along vertical line 2—2 in FIG. 1B; the square cross section of the trench containing capacitor 12 and transistor 18 is apparent in FIG. 1B.

In cell 30 capacitor 12 is formed with one of its plates being n+ region 50 together with n region 48 and the other plate being substrate 32 together with epilayer 34; however, the doping of epilayer 34 is much lower than that of p+ substrate 32 so the capacitance of the n/p junction of region 48 and epilayer 34 and the capacitance of n+ region 50/oxide 52/p epilayer 34 are both much less than the capacitance of n+ region 50/oxide 52/p+ substrate 32 and may be ignored. Also, as will be detailed below, the plate area of epilayer 34 is small compared to that of substrate 32, and this further makes insignificant the capacitance associated with epilayer 34. Consequently, the bulk of the charge stored by capacitor 12 is isolated from substrate 32 (and epilayer 34) by oxide 52. For a trench with a one micron by one micron cross section and six micron depth, the capacitor 12 plate area would be about 21 square microns if one micron of the depth is epilayer 34 and bit line 20. P+ substrate 32 is the ground common to all cells 30 in an array.

Transistor 18 in cell 30 is entirely in bulk silicon with a polysilicon gate; channel region 44 is part p epilayer 34, source region 48 (which is also a part of a plate of capacitor 12) and drain region 20 are n diffusions in p epilayer 34 gate oxide 46 is grown on the trench surface of p epilayer 34, and gate 16 is part of polysilicon word line 14. Field oxide 36 is fairly thick and minimizes the capacitance of bit line 20.

The dimensions and materials characteristic of cell 30 are best understood in connection with the following description of a first preferred embodiment method of fabrication; Figs. 3A through 3G illustrate the sequence of process steps.

Figure 3A:
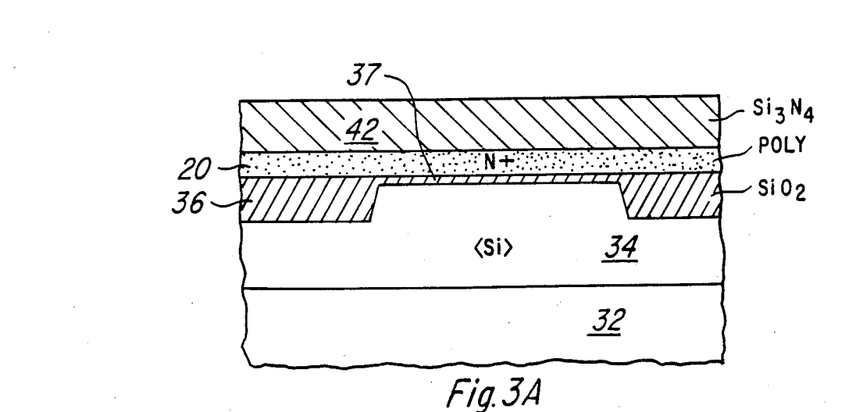
FIGS. 3A through 3K illustrate a sequence of process steps for fabrication of one embodiment of a memory cell including the present invention by a method which is another embodiment of the present invention.
Figure 3B:
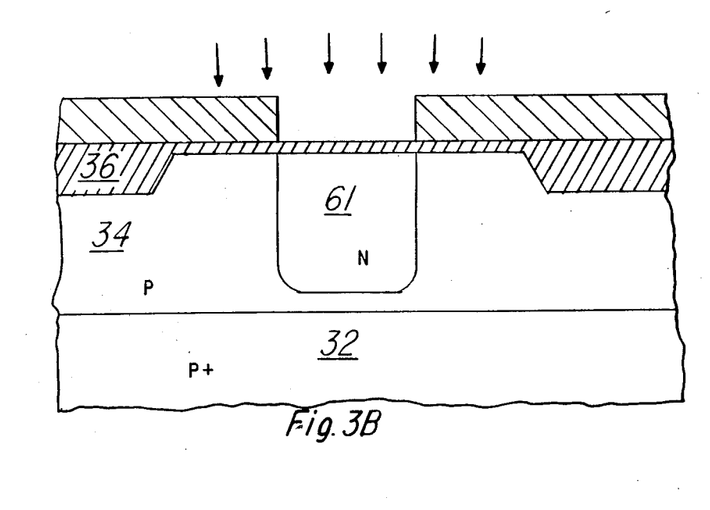
Figure 3C:
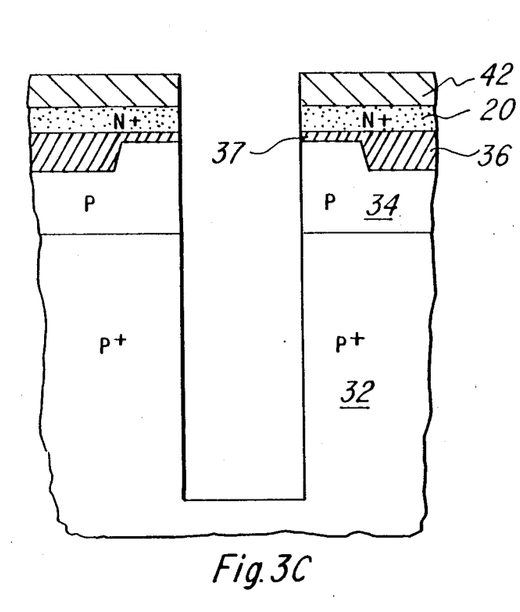

1. (100) oriented p+silicon substrate 32 of resistivity less than 1E-2 ohm-cm has p epilayer 34 grown with a carrier concentration of $2E16/cm^3$ and thickness such that after all thermal processing the final p epilayer thickness is two microns. Field oxide 36 (including protective oxide 37) is formed by standard processing. As an example, SWAMI process may be used (grow stress relief oxide, deposit low pressure chemical vapor deposition (LPCVD) nitride, pattern and plasma etch the nitride-oxide-silicon, boron implant for channel stops, grow second stress relief oxide, deposit second nitride, deposit LPCVD oxide, plasma etch LPCVD oxide-nitride, wet etch filaments of LPCVD oxide remaining from previous etch, thermally grow field oxide to yield an approximately planar structure, and strip the nitrides). Regardless of the method used, the final thickness of field oxide 36 is 5000A and protective oxide 37 is about 200A thick.

In a separate region of the substrate 32,34, an embodiment of the present invention is fabricated. Generally, the same processing steps used to fabricate cell 30 are used to fabricate the described embodiment of the invention. Where the processing steps deviate it is indicated as in FIG. 3B. The structure of FIG. 3B includes field oxide 36 and protective oxide 37. An ion implantation mask 63 is formed and patterned using techniques well known in the art. An ion implantation of Phosphorus ions having an energy of approximately 50 kiloelectron-Volts and a density of approximately $2 \times 10^{12}$ ions per $cm^3$ is performed which is driven in to form N-well 61.

Returning to FIG. 3A, 2000A of polysilicon 20 is deposited by LPCVD, doped to a carrier concentration of 1 E20/cm3, and patterned and etched to form bit lines 20. Optionally an n+ diffused bitline can be substituted for the polysilicon bitline. Next, 10,000A of nitride 42 is deposited by LPCVD; see FIG. 3A. A layer composed of deposited nitride and oxide could also be used for layer 42.

2. Nitride 42 is patterned to define the one micron square trenches. The patterned nitride 42 is then used as the mask for reactive ion etching (RIE) with hydrochloric acid excavation of the trenches to a depth of 8 microns. The trench walls are cleaned of RIE damage and contamination with a wet acid etch; see FIG. 3C. Note that oxide 42 is alos partially removed by the RIE.

Figure 3D:
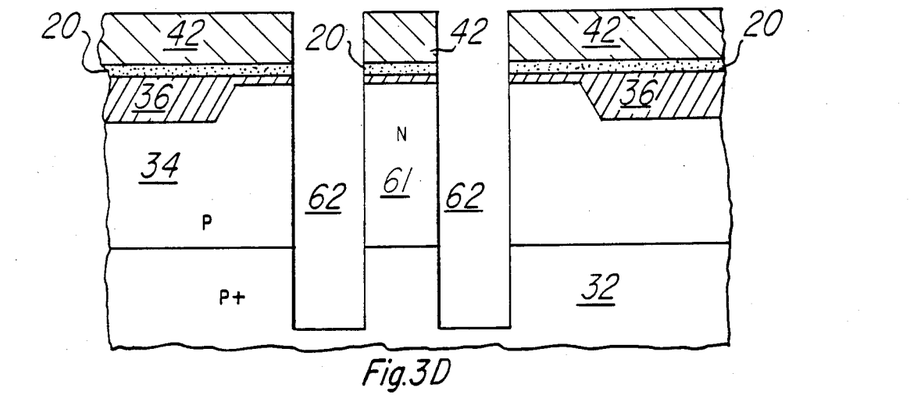
Figure 3E:
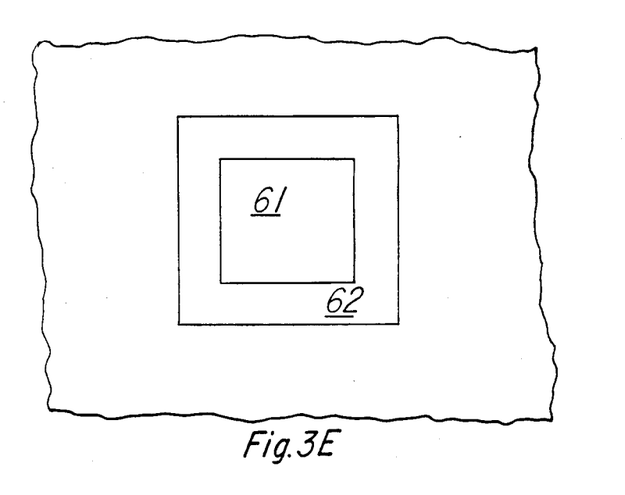
Figure 3F:
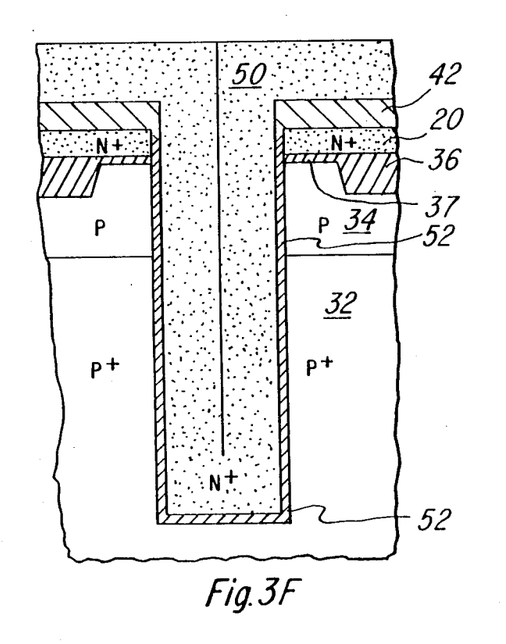
Figure 3G:
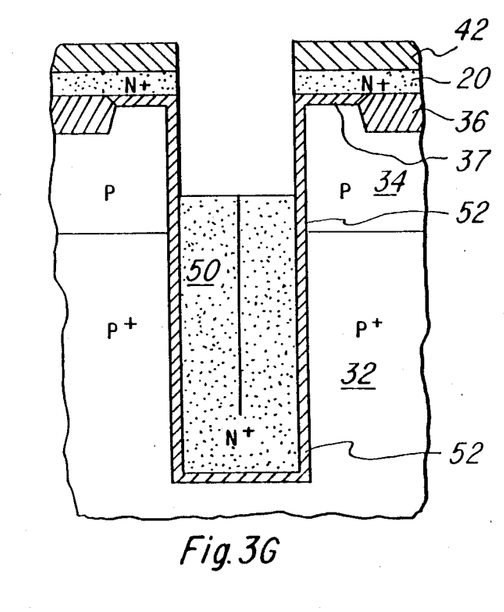

Trench 62 in FIG. 3D is etched in a slightly different configuration. Trench 62 is designed to surround N-well 61. A schematic side view is shown in FIG. 3D and Figure 3E is a plan view showing N-well 61 and trench 62.

3. Oxide 52 is grown to a thickness of 200A on the trench walls and bottom. The trench is then filled with n+ doped polysilicon as part of a deposition of 7000A of n+ polysilicon by LPCVD; see FIG. 3F.

4. Polysilicon 50 is planarized, such as with spun on photoresist, and etched completely away on the surface and down into the trench to about 3000A above the epilayer 34/substrate 32 interface; see FIG. 3G. As will be seen below, the location of the top of the remaining polysilicon 50 in the trench will approximately determine the bottom of the channel of transistor 18. Note that nitride layer 42 is further eroded by the plasma etch but is still at least 2000A thick.

5. The exposed portion to oxide 52 is etched, and this etching is continued to overetch 1000 to 2000A of oxide. This overetch removes the top portion of oxide 52 between epilayer 34 and polysilicon 50 to a depth of 1000 to 2000A, as indicated by arrows 53 in FIG. 3H; and also removes 1000 to 2000A of protective oxide 37 between epilayer 34 and bit line 20, as indicated by arrows 39 in FIG. 3H. This overetch in effect is forming two small annular crevices, each with a depth of 1000 to 2000A and a width of 200A; one of these small crevices girdles the top portion of polysilicon 50 as indicated by arrows 53, and the other of these small crevices runs horizontally around the boundary of bit line 20 as indicated by arrows 39.

Figure 3H:
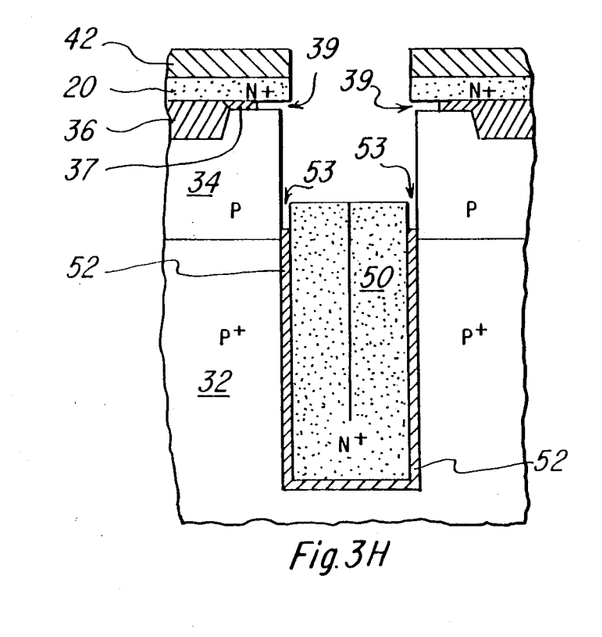
Figure 3I:
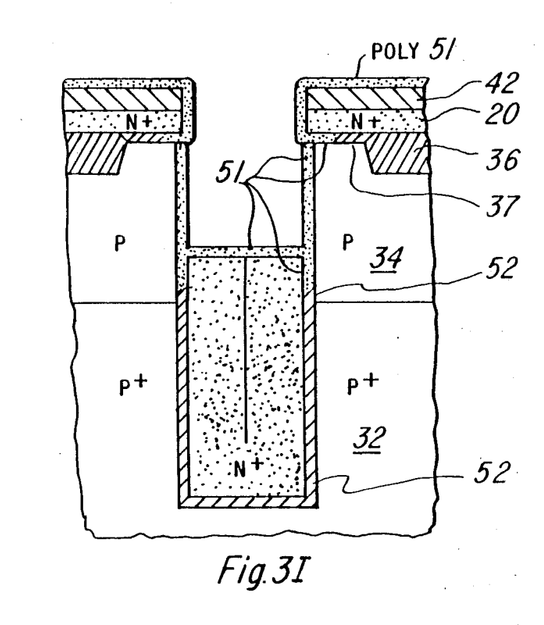

6. 500A of polysilicon 51 is deposited by LPCVD, this is sufficient thickness to insure that the small crevices indicated by arrows 53 and 39 in FIG. 3H are filled; see FIG. 3I.

Figure 3J:
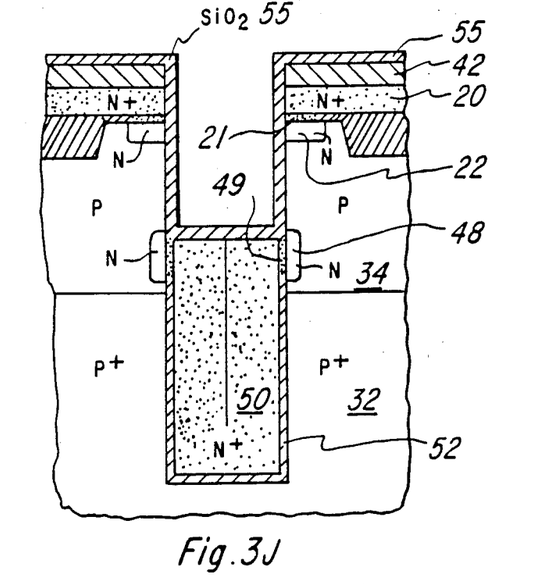

7. 500A of oxide 55 is thermally grown, this is just enough oxidation to oxidize all of polysilicon 51 except for that portion in the small crevices indicated by arrows 53 and 39 in FIG. 3H, which are too far from the oxidizing interface. This amount of oxidation also consumes very little of epilayer 34. The high temperatures of the thermal oxidation of polysilicon 51 causes the dopant in n+ polysilicon 50 to diffuse through the polysilicon 51 in the small crevice indicated by arrows 53 and into p epilayer 34; this diffusion of dopants forms n type polysilicon region 49 and n type region 48 in p epilayer 34; see Fig. 3J. Further, a similar diffusion of dopants from bit line 20 through the polysilicon in the small crevice indicated by arrows 39 and into epilayer 34 forms n polysilicon region 21 and n type region 22 in epilayer 34; see FIG. 3J. As an option, the 500A of polysilicon 51 can be removed by a timed wet chemical silicon etch from regions other than the refilled crevice regions 39 and 53. This can then be followed by a thermal anneal to diffuse the n+dopants into regions 53 and 39. The n+ polysilicon contacts formed in regions 53 and 39 are called Buried Lateral Contacts. As can be seen from FIG. 3J, the Buried Lateral Contacts allows the trench transistor to be connected to the trench capacitor and to the polysilicon bitline in an efficient and compact manner.

8. Oxide 55 is etched away, and gate oxide 46 plus insulating oxide 56 thermally grown; gate oxide 46 is grown to a thickness of 250A, and oxide 56 is, consequently, somewhat thicker because it is simultaneously grown on n+ doped polysilicon 50. Lastly, 7000A of n+ polysilicon is deposited by LPCVD and patterned and etched to form word lines 145. See FIG. 2 for the completed cell. Note that gate 16 (the portion of word line 14 opposite channel 44) controls all of channel 44 despite the thickness of oxide 56 because n region 48, which forms the source for transistor 18, is formed by a diffusion of dopants from polysilicon 50 through polysilicon region 49 and thus extends into epilayer 34 vertically from region 49 as well as horizontally. This vertical diffusion extends sufficiently so that gate 16 will control all of channel 44.

Figure 3K:
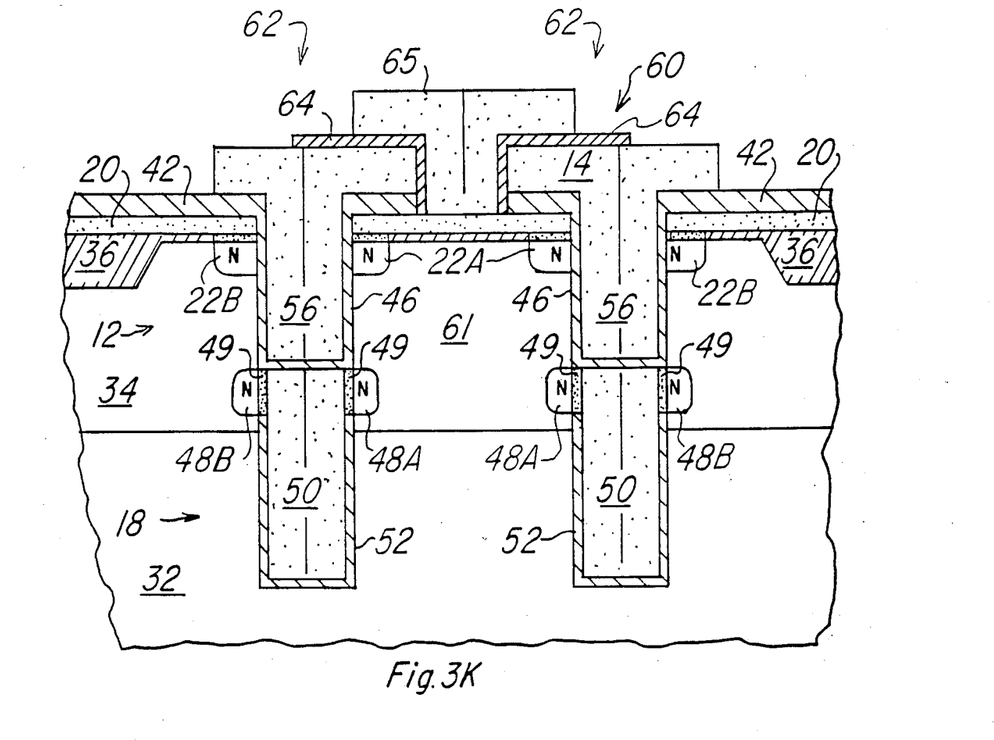

FIG. 3K is a side view schematic diagram of separately accessed transistor 60. Components in FIG. 3J bearing the same number as components in FIG. 2 perform the same function as the components in FIG. 2 and are fabricated during the corresponding processing steps. Contact 65 is formed using well known techniques to provide contact to N-well 61. N-well 61 provides a short across source region 48A and drain region 22A inside the cylinder formed by trench 62 (source region 48A and drain region 22A form a ring inside this cylinder). Thus contact 65 is connected to source region 48B on the outside of the cylinder through polycrystalline silicon region 50, source region 48A, N-well 61, drain region 22A and polycrystalline silicon layer 20. Therefore, drain region 22B, gate 14 and source region 48B transistor of cell 60 can be accessed via the surface of the substrate. In addition, the capacitor of cell 160 can be separately accessed via contact 65 and a contact (not shown) to substrate 32. This allows the measurement of the characteristics of the capacitor and the transistor of cell 60.

Many modifications of the preferred embodiments are available which still fall within the scope of the invention in that such modifications, either singly or in combinations, do not disrupt the storage of signal charge by the capacitor nor the on/off function of the transistor. Such modifications include the following:

The trench cross section could be whatever shape is convenient, such as circular, rectangular, arbitrary convex, corrugated, even multiconnected (i.e. involving multiple trenches) and could even vary along the vertical, continuously or in steps or both. Similarly, the trench sidewalls need not be vertical, rather any geometry that can be processed should work to a greater or lesser extent, such as bulging, tapered, and sloped sidewalls; indeed, any simply connected trench is functionally equivalent to the parallelepiped of the preferred embodiment. Lastly, the dimensions of the trench (depth, cross sectional area, diameter, and so forth) may be varied but in practice are a tradeoff of process convenience, capacitance required, substrate area, and so forth. Of course, the capacitance required depends upon the refresh time, transistor leakage current, supply voltage, soft error immunity, capacitor leakage current, et cetera.

The capacitor insulator can be of any convenient material such as oxide, nitride, oxidenitride, oxide-nitride-oxide, and other stack combinations, and the oxide could be thermally grown, LPCVD, grown dry or in steam, and so forth. The thickness of the insulator is a tradeoff of process convenience, insulator realibility, dielectric constant, breakdown voltage, and so forth and may vary widely. Of course, if the cell and array are fabricated in semiconductor material other than silicon (such as gallium arsenide, aluminum gallium arsenide, mercry cadmium telluride, germanium, indium phosphide, and so forth), the capacitor insulator will be a corresponding material. Also, for the capacitor formed by a reverse biased junction, the doping profiles may be varied, the choice will be a tradeoff of process convenience, cell size, capacitor performance, and so forth. Similarly, amorphous silicon could be used in place of polysilicon, and the etch back to from the crevices may be wet or dry (plasma).

The transistor can be formed to operate with a variety of threshold voltages by adjusting the threshold voltage (such as by a shallow diffusion on the channel just prior to gate oxide growth or deposition). The doping levels and the doping species can be varied so as to vary the transistor characteristics; not that the transistor channel length is determined approximately by trench depth and channel width is roughly equal to the trench perimeter and that n-channel and p-channel devices require oppositely doped regions. The transistor gate may be polysilicon, metal, silicide, and so forth. All of these variations affect performance of the transistor but are acceptable if the transistor adequately peforms as a pass transistor for the cell in view of the other characteristics of the cell including required read and write times, the capacitance, the refresh time, and so forth.

TECHNICAL ADVANTAGES

The described embodiments of the present invention provide a structure and method for separately accessing vertically integrated components.

I claim:

1. A semiconductor device for contacting integrated circuit components comprising:
   a substrate including a trench therein, wherein said trench surrounds a portion of said substrate;
   said substrate further including a surface;
   said trench including trench sides and a trench bottom;
   a capacitor formed within said trench out of direct contact with said surface;
   a field effect transistor including a drain, source and gate, said drain and source including majority dopants of the same type;
   said drain and source, both surrounding said trench, being situated substantially along said trench sides, and defining a channel region, along said trench sides, which surrounds said trench;

said source contacting said capacitor;

a well region of the same majority carrier type throughout for accessing said capacitor;

said well region being located within said portion of said substrate surrounded by said trench thereby allowing electrical access to said transistor and said capacitor for testing purposes.

2. A semiconductor device for contacting integrated circuit components comprising:

a substrate including a trench therein, wherein said trench surrounds a portion of said substrate;

said portion including a well region of the same majority carrier type throughout;

a first insulating layer substantially lining said trench;

a first conductive material positioned within said trench, said first conductive material acting as a first capacitor plate of a capacitor including the substrate acting as a second capacitor plate and the insulating layer acting as a dielectric;

said trench being surrounded by trench sides;

a source, surrounding said trench, being situated substantially along said trench sides and contacting said first conductive material;

a drain, surrounding said trench, being situated substantially along said trench sides and being spaced from said source so as to define a channel region between said source and said drain, said drain and said source including majority dopants of the same type;

a second conductive material at least partially within said trench;

a second insulating layer between said first conductive material and said second conductive material;

said second conductive material acting as a gate of a field effect transistor including said drain and said source;

whereby said transistor and said capacitor can be accessed and thus tested through a circuit connection including said well region, said source, said channel and said drain.

3. A semiconductor device as recited in claim 2 wherein said first conductive material contacts said source through a polycrystalline silicon connection.

4. A semiconductor device as recited in claim 2 which further includes a third conductive material that contacts said drain so as to act as a bit line to the drain.

5. A semiconductor device as recited in claim 4 wherein said third conductive material contacts said drain through a polycrystalline silicon connection.

* * * * *